United States Patent [19]
Mattausch

[11] Patent Number: 6,141,287
[45] Date of Patent: Oct. 31, 2000

[54] MEMORY ARCHITECTURE WITH MULTILEVEL HIERARCHY

[75] Inventor: Hans-Jürgen Mattausch, Higashi-Hiroshima, Japan

[73] Assignee: Infineon Technologies AG, Munich, Germany

[21] Appl. No.: 09/154,483

[22] Filed: Sep. 16, 1998

[30] Foreign Application Priority Data

Sep. 16, 1997 [DE] Germany .......................... 197 40 695

[51] Int. Cl.[7] .................................................. G11C 8/00
[52] U.S. Cl. ............................... 365/230.03; 365/230.06; 711/117
[58] Field of Search ..................... 365/230.03–230.06, 365/63, 189.01; 711/117

[56] References Cited

U.S. PATENT DOCUMENTS

| | | | |
|---|---|---|---|
| 5,170,375 | 12/1992 | Mattaush et al. | 365/230.03 |
| 5,530,814 | 6/1996 | Wong et al. | 710/132 |
| 5,914,906 | 6/1999 | Iadanza et al. | 365/230.03 |
| 6,038,192 | 3/2000 | Clinton et al. | 365/230.03 |
| 6,044,031 | 3/2000 | Iadanza et al. | 365/230.03 |

FOREIGN PATENT DOCUMENTS

| | | |
|---|---|---|
| 0 393 434 B1 | 10/1990 | European Pat. Off. . |
| 42 07 945 A1 | 9/1992 | Germany . |

OTHER PUBLICATIONS

"Random Access Memory", (Glasser et al.), The Design and Analysis of VLSI Circuits, Chapter 7.3, pp. 388–400.
"A Single Chip Multiprocessor for Multimedia: The MVP" (Guttag et al.), IEEE 1992, pp. 53–65.

*Primary Examiner*—Do Hyun Yoo
*Assistant Examiner*—Hong Kim
*Attorney, Agent, or Firm*—Herbert L. Lerner; Laurence A. Greenberg; Werner H. Stemer

[57] ABSTRACT

The memory is made up of memory cells disposed in a memory architecture with multilevel hierarchy. Many external connection ports are provided. Such memories are generally called multiport memories. The novel multiport memory architecture with multilevel hierarchy typically has one-port memory cells in the lowermost hierarchical level. The memory blocks in the respectively higher hierarchical levels are each made up of memory blocks from the next lower hierarchical level. By the defined multiport memory architecture with multilevel hierarchy, the expenditure for surface area on the chip can advantageously be reduced. The memory blocks in the hierarchical levels can, depending on requirements, be disposed in a memory block matrix in a switching network, a banking technique arrangement, and so forth. Depending on the desired application, the greatest possible freedom of design is provided. The multiport memory architecture also has a circuit for handling access contentions. The novel memory architecture can be applied to all memory technologies as well as to logic technologies.

17 Claims, 2 Drawing Sheets

MEMORY ARCHITECTURE WITH MULTILEVEL HIERARCHY

BACKGROUND OF THE INVENTION

Field of the Invention

The invention relates to a memory made up of memory cells and having an architecture with multilevel hierarchy.

Future microelectronic circuits will achieve complicated systems with transistors numbering in the range from $10^{12}$ to $10^{15}$. As a rule, these systems, such as parallel processor systems, artificial intelligence systems, or multimedia systems, will include a plurality of cooperating subsystems for processing data. One decisive problem for the efficient practical realization of these future systems will thus be the storage of the data to be processed, as well as their data processing programs. The most powerful systems will surely be realizable if a memory is available to which the subsystems can gain access chronologically parallel and with a high bandwidth. Such memories, which have multiple ports as external terminals, to which the external component units can gain access chronologically parallel, are generally known as multiport memories. An especially important peripheral condition for economical reasons is naturally the least possible expenditure for surface area on the chip. Other peripheral conditions are due to the demand for the shortest possible access times to the memory cells or ports, and the least possible power loss of the entire memory system.

L. A. Glasser and D. W. Doberpohl, The Design and Analysis of VLSI Circuits, Addison-Wesley, ISBN 0-20one-12580-3, pp. 388–390 discloses one such multiport memory. The reference shows a multiport memory which implements the desired number of external ports in each individual memory cell. Each individual memory cell therefore takes up a great amount of chip area. A further factor is considerable expense for decoding for each port, so that the complete multiport memory in the final analysis becomes extremely expensive in terms of surface area. This simplest version of a multiport memory is thus also the least favorable in terms of surface area and thus the most expensive version.

A further multiport memory is known from K. Guttag, R. J. Gove, and J. R. van Aken, A Single Chip Multiprocessor for Multimedia: The MVP, IEEE Computer Graphics and Appls., Vol. 12, 1992, pp. 53–64. The problem described above is solved here by a so-called cross rail distributor, on whose input side the desired external ports are located, and on whose output side a plurality of conventional memory blocks with single-port memory cells are connected. The proposal does advantageously make do with one-port memory cells, but the cross rail distributor, which is often also called a switching network, in practice again requires a very great amount of chip area and creates a high power loss because of the long wiring lines. Because a very high number of memory blocks cannot be connected, the number of unsuccessful accesses, that is, if more than one port seeks access to a particular memory block at the same time, is relatively high.

The use of hierarchically designed memory architecture for other purposes is known from the pertinent literature. The most important of these purposes was until now shortening the effective access time via a single, conventional external port. Especially in dynamic memories (DRAMs), which are slow in principle, shortening the effective access time is important so as not to allow any overly great difference in terms of clock speeds of the microprocessors currently in standard use. In a memory device, access time is essentially the product of the transit time of the data signals on the word line and the reloading of the memory capacitances. The hierarchical arrangement seeks to shorten the effective length of the conductor tracks in order to reduce the access time accordingly.

A memory configuration that operates by the banking technique is in a certain sense this kind of hierarchically designed memory. In the banking technique, the fact that data transport over a data bus is substantially faster than a memory access is exploited. It is therefore possible in principle to read out data from a plurality of memory blocks in parallel, buffer-store them in high-speed registers, and output them to the outside via a data bus at high speed. For the application of the banking technique, however, it is very important that the sequentially demanded data be located with high probability in different blocks. If that is not the case, then requests for access must be rejected. The essential component in banking is therefore the detailed algorithm for distributing the stored data among the various memory blocks. In practice, the number of memory blocks in banking is limited to a relatively low number, typically 32 memory blocks. In addition, the access times to the individual memory blocks are slow.

A memory architecture that also utilizes a memory hierarchy is is described in the commonly assigned U.S. Pat. No. 5,170,375 (European Patent EP 0 393 434 B1). The prior patent discloses a memory built up with a multilevel hierarchy, which has a single conventional external port. It exploits the fact that the signal transit time in the critical conduction path, when the memory is subdivided into a plurality of hierarchical levels, can be shortened. However, the hierarchical subdivision of the memory is intended there to avoid burdening parts of the critical path. Because of the extremely high parasitic capacitances and resistances in the word line and bit line portions, signal changing times would otherwise be too long, thus leading to overly long access times to the external port.

With regard to further details, characteristics, advantages and the mode of operation of hierarchically designed single-port memory architectures, the above U.S. Pat. No. 5,170,375 and the largely corresponding European Patent EP 0 393 434 B1 are hereby incorporated by reference in their entirety.

SUMMARY OF THE INVENTION

It is accordingly an object of the invention to provide a memory architecture with multilevel hierarchy that has a plurality of external ports, which is even further improved with regard to the critical features of such memories.

With the foregoing and other objects in view there is provided, in accordance with the invention, a memory architecture, comprising:

- a plurality of hierarchical levels, including a lowermost hierarchical level and at least one higher hierarchical level;
- at least one memory block in each of the hierarchical levels, the memory block in the lowermost hierarchical level including individual memory cells, and each next-higher hierarchical level including memory blocks formed by memory blocks of a respectively next-lower hierarchical level;
- decoder devices in each of the hierarchical levels for driving, reading, and writing the memory blocks;
- at least one I/O interface with a plurality of I/O ports being driveable in parallel simultaneously and independently of one another; and
- an address selection circuit and a port selection buffer circuit in at least one of the hierarchical levels.

The memory architecture with multilevel hierarchy according to the invention thus has many external connection ports, which are accessible simultaneously, entirely in parallel.

In accordance with an added feature of the invention, the memory blocks in the lowermost hierarchical level are formed with one-port memory cells.

In accordance with an additional feature of the invention, an access contention resolution circuit is provided in at least one of the hierarchical levels. The access contention resolution circuit, in event of an access contention among a plurality of I/O ports of a given memory block, enables one of the I/O ports involved in the access contention and blocks or inhibits all the other I/O ports that are involved in the access contention.

In accordance with another feature of the invention, the access contention resolution circuit executes a prioritizing algorithm for prioritizing the I/O ports in accordance with a significance thereof.

Each of the hierarchical levels has many different memory blocks. The memory blocks in the lowermost hierarchical level comprise many memory cells. It would also be conceivable for the lowermost hierarchical level to comprise only a single memory cell. For most requirements, the use of two hierarchical levels is usually entirely sufficient. In that case, however, the memory block in the lowermost hierarchical level should comprise at least two or more memory cells.

The multiport memory architecture according to the invention advantageously makes it possible to use one-port memory cells in the lowermost hierarchical level. It would naturally also be conceivable to use two-port or multiport memory cells. However, using one-port memory cells proves to be especially advantageous for reasons of surface area optimization, especially on account of the electrical conductor tracks (word lines and bit lines). On the basis of SRAM design data, compared with the use of multiport memory cells, an increasing economy of surface area as a function of the number of ports can be attained, that is, an economy of about 30% for two ports to approximately 70% for 16 ports. The use of such static one-port memory cells (SRAM cells) thus proves to be especially economical.

In accordance with a further feature of the invention, the memory blocks in at least one of the hierarchical levels are disposed in matrix form in a memory block matrix with a first number of matrix rows and a second number of matrix columns.

In accordance with again a further feature of the invention, the first number and/or the second number is a multiple of 2.

In accordance with again an added feature of the invention, the memory block matrix includes a row decoder for selecting a row in the memory block matrix via corresponding address bits.

In accordance with again an additional feature of the invention, the memory block matrix includes a column decoder for selecting a column in the memory block matrix via corresponding address bits.

In accordance with again another feature of the invention, the memory blocks in at least one of the hierarchical levels are arranged in a switching network arrangement. Alternatively, they are arranged according to the so-called banking technique.

In other words, the arrangement of the memory blocks in the various hierarchical levels can be designed in various ways. The matrix arrangement of a hierarchical level is particularly advantageous. It is then especially advantageous if the number of columns and rows of the memory block matrix is a multiple of 2.

However, it is also conceivable for the memory blocks in the hierarchical levels to be disposed in a switching network arrangement, by the banking technique, or the like. The arrangement of the various memory blocks within the various hierarchical levels is then left to the freedom of the system design. It would also be conceivable if a different arrangement of memory blocks were used in each of the various hierarchical levels.

In addition to its application to system integration, the invention is quite naturally applicable for multiport memory chips that are favorable in terms of surface area. It is not limited to a particular type of memory but instead is applicable to all types of nonvolatile, static and dynamic memories and the memory technology on which they are based. The invention is especially advantageous in static memories (SRAMs) and dynamic memories (DRAMs). However, the invention also proves to be advantageous particularly in logic memories, such as all kinds of programmable read-only memories (PROMs, EPROMs and EEPROMs). Furthermore, the memory architecture of the invention is also appropriate in conventional ROMs. ROMs are preferred in processor components, and for reasons of space an application of the hierarchical architecture is especially attractive in that case.

It is also conceivable for different technologies to be used in the various planes. For the so-called embedded memory, for instance, the lowermost plane could be made by memory technology and the upper hierarchical levels could be made by logic technology. The memory architecture employed is thus largely independent of the technology used. The invention is especially advantageous in dynamic memories (DRAMs), because here the capacities of the memory cells can be made relatively small, because of the shorter effective line lengths.

Despite the disposition of the memory among a plurality of hierarchical levels, the access time per port is no worse. The effect of converse development arises here. Additional gates, such as an additional multiplexer, does worsen the access time because of the additional transit time. However, the dimensions of the individual memory blocks and thus of their conductor tracks are then smaller, which in turn means a shortening of the access time. Because of the reduced parasitic capacitances and resistances in the critical line path, the access time is still further improved.

The fact that per port and per access only a single memory block in the upper hierarchical levels is activated, while the other memory blocks, not used, are in a sense turned off, leads to a lesser power loss in the entire memory architecture. The other, unused memory blocks are thus quasi-shut off.

Furthermore, multiport memory architectures in the prior art are limited in their design by the so-called matrix circuits, which essentially comprise the row and column decoder circuits. Especially when there are provided a great number of connection ports, the control lines of the decoder circuits with the drivers they contain can no longer lead to the appropriate memory cells. The number of connection ports in such multiport memory architectures is thus limited by the design. By means of the invention, it is advantageously possible to adapt the design of the multiport memory architecture to given space requirements. The various matrix circuits can be distributed among a plurality of hierarchical levels. Furthermore, the connection ports of the multiport memory architecture can be distributed among the various hierarchical levels. The given multilevel hierarchy thus allows an arbitrary freedom of design.

Other features which are considered as characteristic for the invention are set forth in the appended claims.

Although the invention is illustrated and described herein as embodied in a memory architecture with multilevel hierarchy, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
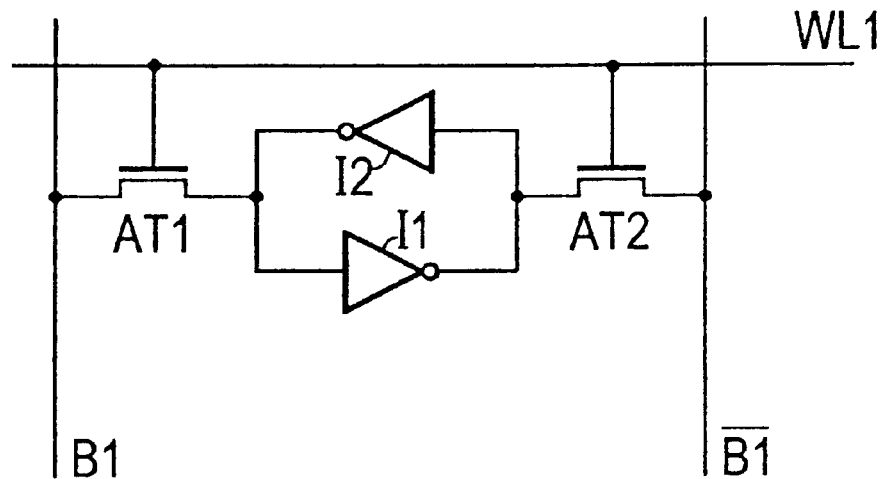
FIG. 1A is a schematic diagram of a static one-port memory cell.
Figure 1B:
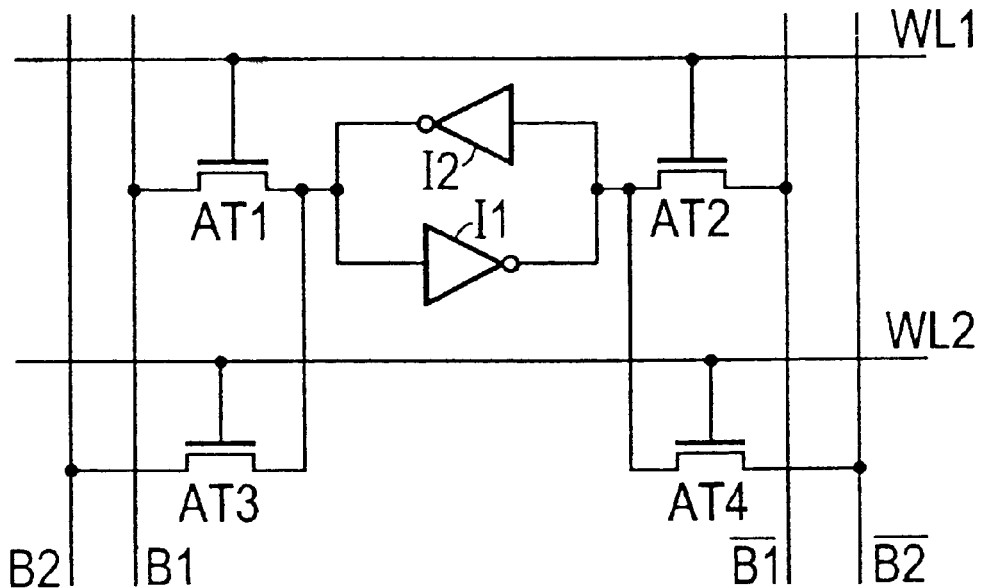
FIG. 1B is a schematic diagram of a static multiport memory cell.

Referring now to the figures of the drawing in detail and first, particularly, to FIG. 1A and FIG. 1B thereof, there is seen a comparison between a static one-port memory cell (FIG. 1A) and a static multiport memory cell (FIG. 1B), which in the present example has two connection ports.

The one-port memory cell in FIG. 1A has two selection transistors AT1, AT2 and two inverters I1, I2. The first selection transistor AT1 is connected between a data line B1 for readin/readout of information and one input of the first inverter I1; the second inverter I2 is fed back in parallel to the inverter I1. The second selection transistor AT2 of the memory cell is connected between one output of the first inverter I1 and a data line B1; the second data line $\overline{B1}$ has the inverted signals compared with the first data line B1. The control terminals of the selection transistors AT1, AT2 are additionally connected to a word line WL1. Via the word lines WL1, the selection transistors AT1, AT2 can be selectively switched between the conducting state and the blocked state.

In FIG. 1B, a multiport memory cell is shown, which in the present example has two ports. This so-called two-port memory cell is constructed similarly to the one-port memory cell of FIG. 1A. In addition, the two-port memory cell also has two further selection transistors AT3, AT4, which like the selection transistors AT1, AT2 are coupled to the two inverters I1, I2 of the memory cell. The two-port memory cell in FIG. 1B also has a second word line WL2 and two further data lines B2, $\overline{B2}$. The word line WL2 and the data lines B2, $\overline{B2}$ are, as in FIG. 1A, connected accordingly to the corresponding selection transistors AT3, AT4.

The lines WL1, B1, $\overline{B1}$ form the first port of the memory cell, and the lines WL2, B2, $\overline{B2}$ form the second port of the memory cell. Multiport memory cells with a corresponding number of output ports are then provided, beginning at the memory cell in FIG. 1, with a corresponding number of selection transistors and lines. As the number of ports of a memory cell increases, the wiring expense thus also increases, as noted at the outset. In terms of the surface area expense, the one-port memory cell is thus the most economical form.

Figure 2:
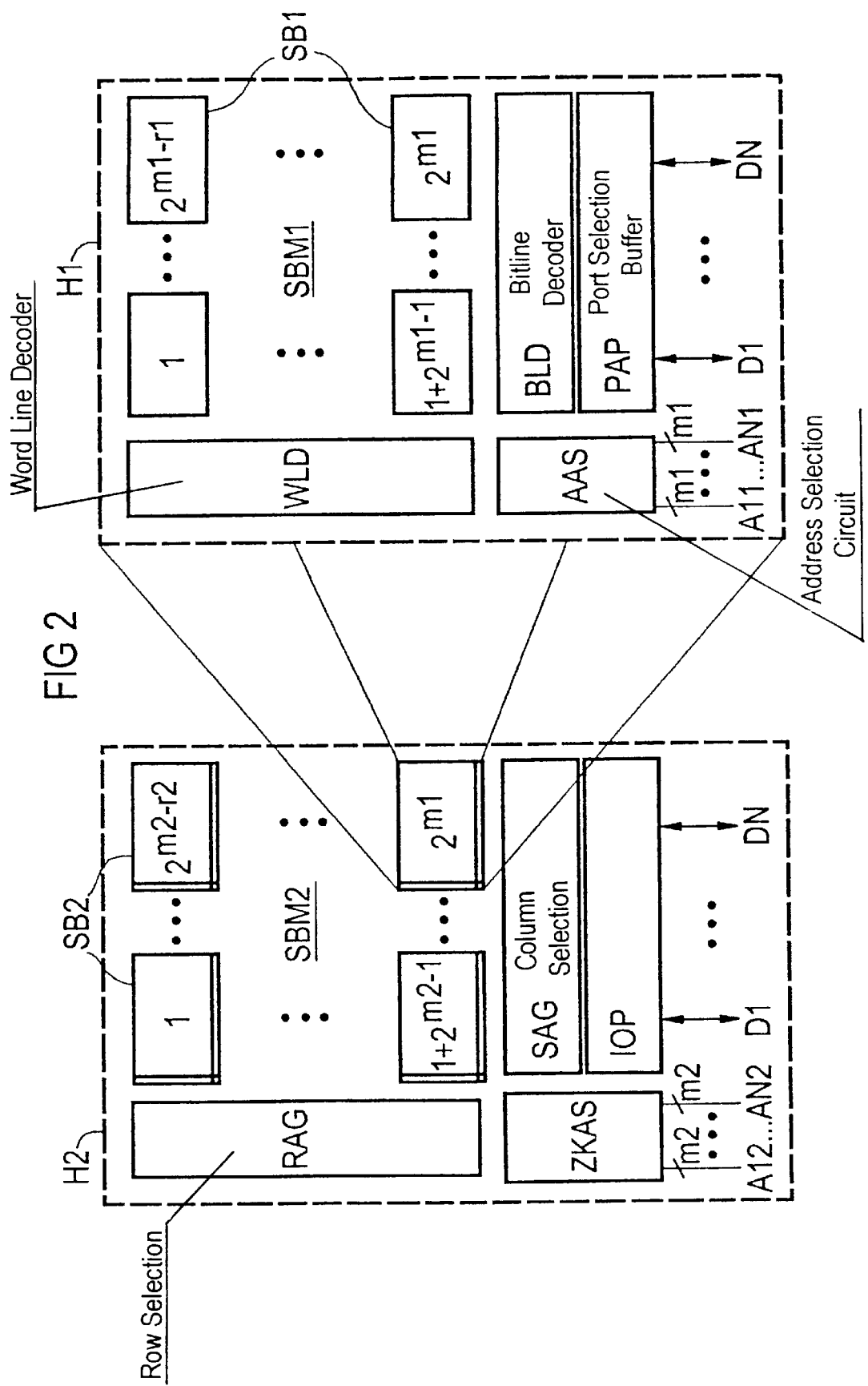
FIG. 2 is a schematic diagram of an exemplary embodiment of a multiport memory architecture with multilevel hierarchy according to the invention.

The memory architecture of the invention utilizes a two-level hierarchy internally in the memory, in order to accomplish the transition from a single port, implemented in each memory cell, to the external ports of the multiport memory. The principle of this multiport memory architecture according to the invention with multilevel hierarchy is shown in FIG. 2. In the exemplary embodiment, two hierarchical levels and a number N of output ports are shown.

The memory architecture with multilevel hierarchy according to the invention, in the present example, has two hierarchical levels H1, H2. It would also be conceivable to use more than two hierarchical levels to realize the memory architecture of the invention. The first hierarchical level is designed H1 and the second hierarchical level is designated H2. In addition, the elements of the first hierarchical level H1 will have the index 1 added, while the elements of the second hierarchical level H2 have the index 2 added.

For the sake of simplicity, in all the hierarchical levels H1, H2, the wiring lines and in particular the word lines and bit lines are not shown.

In the present exemplary embodiment, the two hierarchical levels H1, H2 are constructed in equivalent fashion, each including a respective memory block matrix as well as selection means for the selected readout of individual memory blocks. The selection means are embodied in the present example as row decoders and column decoders. There is also provided an interface with the next-higher hierarchical level.

It is naturally also conceivable for the memory blocks in the various hierarchical levels to be disposed in different ways. For instance, it would be conceivable for the memory blocks in one of the hierarchical levels to be arranged in a switching network arrangement, while the memory blocks in another hierarchical level are arranged in a known memory block matrix, for example. It is thus not absolutely necessary for the various hierarchical levels H1, H2 to be identical to one another. The arrangement of memory blocks in the various hierarchical levels can thus be adapted to the application or to the requirements of the user and is thus one further degree of freedom in the design of the memory architecture.

The first hierarchical level H1 contains a first memory block matrix SBM1. The first hierarchical level H1 also includes a word line decoder WLD, a bit line decoder BLD, a port selection buffer circuit PAP, and an address selection circuit AAS.

In the present example, the memory block matrix SBM1 of the first hierarchical level H1 includes a number $M1=2^{m1}$ of different memory blocks SB1. which are arranged in a matrix. The memory block matrix SBM1 of the example includes a number $2^{mone-r1}$ of columns and a number $2^{r1}$ of rows. The number of rows and columns in the memory block matrix SBM1 is thus a multiple of 2. Although this is not absolutely necessary, nevertheless it is advantageous in this kind of memory block matrix.

The memory blocks SB1 of the first hierarchical level H1 comprise various memory cells. In the present example, the memory cells in the first hierarchical level are one-port memory cells with a single read/write port. Naturally, it would also be conceivable for the aforementioned memory cells to be so-called multiport memory cells with a corresponding number of read/write ports. It has been noted both in the background section above and in the description of FIG. 1, however, that the use of one-port memory cells in the lowermost hierarchical level H1 is especially advantageous. Nevertheless, it may be favorable to use such multiport memory cells in the lowermost hierarchical level H1 for certain requirements, such as optimizing access time and surface area in a design. In particular, it may be advantageous, where there is a lesser number of memory blocks in one of the higher hierarchical levels, to reduce the likelihood of an access contention.

The memory cells in the first hierarchical level H1 may be designed as arbitrary nonvolatile memory cells (such as EEPROM cells), static memory cells (such as SRAM cells), or dynamic memory cells (such as DRAM cells). The peripheral circuits of the memory blocks must naturally be embodied to suit the selected type of memory cells.

For selecting a single memory cell or a plurality of memory cells in the lowermost hierarchical level H1, a bit line decoder BLD and a word line decoder WLD are provided. In the present example, the bit line decoder BLD has a number m1–r1 of address bits, and the word line decoder WLD has a number r1 of address bits. The first hierarchical level H1 also has an address selection circuit AAS, which is triggered by a number N of different addresses Alone-AN1. Each of these addresses has a width of m1 address bits.

In addition, the first hierarchical level 1 has a port selection buffer circuit PAP with a number N of different output ports D1–DN.

In a readout operation, the mode of operation of the memory arrangement in the first hierarchical level H1 is as follows: An address word is input from the address selection circuit AAS via the address ports Alone-AN1. Beginning with the input address word, the word line decoder WLD and bit line decoder BLD trigger the respective memory cells in the memory block matrix SBM1 in such a way that a data word can be read out. The data word is delivered to the port selection buffer circuit PAP. The port selection buffer circuit PAP assigns the data word to one of the output ports D1–DN. For a writing operation, this cycle proceeds equivalently but in the opposite direction.

The memory architecture of FIG. 2 also has a second hierarchical level H2. The second hierarchical level H2 has a second memory block matrix SBM2, a row-selection generator RAG, a column-selection generator SAG, and an input/output buffer circuit IOP. In the second hierarchical level H2, the memory blocks SB2 in the present example are also embodied as a memory block matrix SBM2.

The layout of the second memory block matrix SBM2 in the second hierarchical level H2 is equivalent to that in the first hierarchical level H1. It is understood that here as well, some different arrangement of memory blocks, such as a switching network or memory blocks arranged by the so-called banking technique, is possible. In the present example, the memory block matrix SBM2 has a number $2^{mtwo-r2}$ of different columns and a number $2^{r2}$ of different rows. In an equivalent fashion to the first memory block matrix SBM1, in the second memory block matrix SB2 the number of rows and columns each is a multiple of 2, but some suitable other number of rows and columns would also be conceivable.

The second hierarchical level H2 also has a row-selection generator RAG for selecting the various rows and a column-selection generator SAG for selecting the various columns in the second memory block matrix SBM2. The row-selection generator RAG thus has N different ports, each with r2 different address bits. The column-selection generator SAG also has N different ports, each with m2–r2 address bits.

The selection of the memory blocks SB2 in the second hierarchical level H2 is effected via the so-called input/output buffer circuit IOP (I/O buffer circuit). The I/O buffer circuit IOP likewise has a number N of different output ports D1–DN. The output ports thus act as the output ports of the multiport memory architecture.

It is understood that it would be also possible for one or more hierarchical levels H1, H2 each to comprise only a single memory block. In the case of the lowermost hierarchical level H1, the memory block matrix SBM1 would then be reduced to a single memory block SB1 and thus to a single memory cell.

According to the invention, the memory blocks SB2 in the second hierarchical level H2 are each made up of memory blocks SB1 and the various peripheral units of the first hierarchical level H1.

If the memory architecture is constructed from many hierarchical levels, then the layout of the memory becomes as follows: In the lowermost hierarchical level H1, the memory blocks SB1 are composed of a number of at least one memory cell. The associated peripheral units, such as word line decoders WLD, bit line decoders BLD, the port selection buffer circuit PAP, and the address selection circuit AAS, are adapted to the particular arrangement of memory blocks in the particular hierarchical level. Each next-higher hierarchical level is then composed of memory blocks of the next-higher hierarchical level. The uppermost hierarchical level then additionally has an I/O buffer circuit IOP with the corresponding output ports of the memory architecture. The N different output ports D1–DN are then the ports of the multiport memory architecture.

The second hierarchical level H2 is thus composed of a number $M2=2^{n2}$ different memory blocks SB2; each individual memory block SB2 contains a number $M1=2^{m1}$ different memory cells.

The total number of memory cells in the memory architecture is thus calculated from the equation $M=M1*M2=2^m$, where m=m1+m2.

According to the invention, a circuit configuration for handling access contentions (conflicts) is also provided in the hierarchical level H2. The circuit is referred to herein as an access contention resolution circuit. Especially in a multiport memory architecture, the so-called access contention resolution circuit is absolutely compulsory, for instance if two or more ports are accessing the same memory block.

In that case, the access selection must be prioritized. The access contention resolution circuit ZKAS is thus a necessity in all conventional N-port memory architectures and thus also in a single N-port memory cell, since access to the same memory cell by two or more ports, at least for writing, is not allowed and represents a conflict.

The functions of the most important subcircuits will be described in further detail below. First, the function of the N-port memory architecture during an access via the N ports will briefly be described. For most of the circuits that occur in the architecture, widely known and used versions in accordance with the prior art are available.

The row-selection generator RAG and the column-selection generator SAG, for each of the N ports, generate row and column selection signals from the respective m2 address bits of the second hierarchical level H2. Parallel to this, the access contention evaluation circuit ZKAS checks the address bits of the second hierarchical level H2 for one or more conflict situations. The activation of the corresponding memory block SB2 is not enabled until the access contention checking has ended, and if in cases of access contention one port is selected, by a predetermined prioritizing algorithm, as authorized to gain access. Thus in the second hierarchical level H2, only one memory block SB2 per port is activated at a time.

In N-port memory architectures, for instance in a N-port memory cell, an access contention has until now been resolved sequentially. However, in a N-port memory architecture this sequential access contention resolution proves to be disadvantageous, since particularly when there are several access contentions the performance of the overall memory architecture is dramatically reduced.

For this reason it is advantageous if access contentions are worked out chronologically completely in parallel. Such parallel working out of access contentions can be done for instance via a prioritizing algorithm which selects one port at a time as authorized for access. For the prioritizing algorithm, by way of example simply ranking the ports in accordance with their importance can be done. In the event of a conflict, the most important port is then always given the right to access. With a status signal, it is signaled to the outside for each port whether the current access was successful or was rejected.

In the first hierarchical level H1, only the m1 address bits of a single port are delivered to the word line decoder WLD and the bit line decoder BLD. The activation signals of the memory blocks SB, thus contain only the information about the port to be activated. This information is used by the address selection circuit AAS to switch the address bits of the associated port to the corresponding decoder. The port selection buffer circuit PAP then at the same time connects the output of the bit line decoder BLD to the data lines belonging t o the port. In addition, the bit line decoder BLD includes an integrated weighting circuit as well as driver means for amplifying the reading signals.

The three circuits, that is, the port selection buffer circuit PAP, the address selection circuit AAS, and the access contention evaluation circuit ZKAS, can be embodied by known methods using conventional circuitry. The first two circuits, that is, the port selection buffer circuit PAP and the address selection circuit AAS, are simple multiplexer and demultiplexer circuits.

The access contention evaluation circuit ZKAS is understood to be dependent on the prioritizing algorithm underlying it. In particular in completely parallel access contention resolution, the switching here can be effected on the basis of a comparison of the address bits, via an XOR gate. The fundamental prioritizing algorithm then determines how the outputs of the XOR gate will be linked in order to generate the appropriate port enable signals.

In FIG. 2, for the sake of simplicity, a word width of one bit has been assumed per port. Naturally the word width can assume arbitrary values within the proposed memory architecture. The system may be further refined by the methods of the prior art.

In a refinement, it is understood that all the known techniques of the prior art for shortening the access time may be employed, in order to refine the multiport memory architecture with multilevel hierarchy according to the invention. In FIG. 2, however, the simplest hierarchical arrangement for memory blocks in various hierarchical levels has been shown. In each of these hierarchical levels, however, one of the known techniques for shortening the access time, such as caching, banking, etc., may also be employed internally in addition.

I claim:

1. A memory architecture, comprising:
   a plurality of hierarchical levels, including a lowermost hierarchical level and at least one higher hierarchical level;
   at least one memory block in each of said hierarchical levels, said memory block in said lowermost hierarchical level including individual memory cells, and each next-higher hierarchical level including memory blocks formed by memory blocks of a respectively next-lower hierarchical level;
   decoder devices in each of said hierarchical levels for driving, reading, and writing said memory blocks;
   at least one I/O interface with a plurality of I/O ports being driveable in parallel simultaneously and independently of one another; and
   an address selection circuit and a port selection buffer circuit in at least one of said hierarchical levels.

2. The memory architecture according to claim 1, wherein said memory block in the lowermost hierarchical level comprises one-port memory cells.

3. The memory architecture according to claim 1, which further comprises an access contention resolution circuit in at least one of said hierarchical levels, said access contention resolution circuit, in event of an access contention among a plurality of I/O ports of a given memory block, enabling one of the I/O ports involved in the access contention and blocking all other I/O ports involved in the access contention.

4. The memory architecture according to claim 3, wherein said access contention resolution circuit is adapted to execute a prioritizing algorithm for prioritizing the I/O ports in accordance with a significance thereof.

5. The memory architecture according to claim 1, wherein said memory blocks in at least one of said hierarchical levels are disposed in matrix form in a memory block matrix with a first number of matrix rows and a second number of matrix columns.

6. The memory architecture according to claim 5, wherein one of the first number and the second number is an integer multiple of 2.

7. The memory architecture according to claim 5, wherein said memory block matrix includes a row decoder for selecting a row in said memory block matrix via corresponding address bits.

8. The memory architecture according to claim 5, wherein said memory block matrix includes a column decoder for selecting a column in said memory block matrix via corresponding address bits.

9. The memory architecture according to claim 1, wherein said memory blocks in at least one of said hierarchical levels are arranged in a switching network arrangement.

10. The memory architecture according to claim 1, wherein said memory blocks in at least one of said hierarchical levels are arranged according to a banking technique.

11. A logic component, comprising the memory architecture according to claim 1.

12. The logic component according to claim 11, wherein said memory cells are EEPROM memory cells.

13. A dynamic memory component, comprising the memory architecture according to claim 1.

14. The dynamic memory component according to claim 13, wherein said memory cells are dynamic DRAM cells.

15. A static memory component, comprising the memory architecture according to claim 1.

16. The static memory component according to claim 15, wherein said memory cells are static SRAM cells.

17. A read-only memory, comprising the memory architecture according to claim 1.

* * * * *